United States Patent
Choi et al.

(10) Patent No.: US 9,263,698 B2
(45) Date of Patent: Feb. 16, 2016

(54) FLEXIBLE DISPLAY APPARATUS AND METHOD OF MANUFACTURING THE SAME

(71) Applicant: Samsung Display Co., Ltd., Yongin, Gyeonggi-Do (KR)

(72) Inventors: Seung-Ho Choi, Yongin (KR); Hyun-Woo Joo, Yongin (KR); Myung-Soo Huh, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/313,009

(22) Filed: Jun. 24, 2014

(65) Prior Publication Data
US 2015/0188080 A1    Jul. 2, 2015

(51) Int. Cl.
*H01L 21/301* (2006.01)
*H01L 51/52* (2006.01)
*H01L 51/56* (2006.01)
*H01L 51/00* (2006.01)
*H01L 21/78* (2006.01)

(52) U.S. Cl.
CPC ........ *H01L 51/5246* (2013.01); *H01L 51/0021* (2013.01); *H01L 51/0097* (2013.01); *H01L 51/5206* (2013.01); *H01L 51/5221* (2013.01); *H01L 51/56* (2013.01); *H01L 21/7806* (2013.01); *H01L 2251/5338* (2013.01); *H01L 2251/558* (2013.01)

(58) Field of Classification Search
CPC .................... H01L 21/3043; H01L 21/7806
USPC .................................. 438/105, 457
See application file for complete search history.

(56) References Cited

U.S. PATENT DOCUMENTS

| 9,112,180 | B2 * | 8/2015 | Son ............ H01L 51/5253 |
| 2012/0118478 | A1 | 5/2012 | Park et al. |
| 2012/0161197 | A1 | 6/2012 | Im et al. |
| 2013/0089954 | A1 | 4/2013 | Ro et al. |

FOREIGN PATENT DOCUMENTS

| KR | 10-0917436 B1 | 9/2009 |
| KR | 1020120050581 A | 5/2012 |
| KR | 10-1174884 B1 | 8/2012 |
| KR | 1020130037275 A | 4/2013 |
| KR | 1020130056038 A | 5/2013 |

* cited by examiner

*Primary Examiner* — Chandra Chaudhari
(74) *Attorney, Agent, or Firm* — Cantor Colburn LLP

(57) ABSTRACT

A flexible display apparatus includes a flexible substrate, a display layer disposed on one surface of the flexible substrate and including a plurality of pixels, graphene disposed on a surface opposing the one surface of the flexible substrate, and an encapsulation layer covering the display layer.

14 Claims, 5 Drawing Sheets

FLEXIBLE DISPLAY APPARATUS AND METHOD OF MANUFACTURING THE SAME

This application claims priority to Korean Patent Application No. 10-2013-0168761, filed on Dec. 31, 2013, and all the benefits accruing therefrom under 35 U.S.C. §119, the disclosure of which is incorporated herein in its entirety by reference.

BACKGROUND

1. Field

One or more embodiments of the invention relate to a flexible display apparatus and a method of manufacturing the same, and more particularly, to a flexible display apparatus that is easily separated from a substrate, and a method of manufacturing the flexible display apparatus.

2. Description of the Related Art

As interest in a flexible display apparatus increases, research into the flexible display apparatus has been actively conducted. In order to realize the flexible display apparatus, a flexible substrate including a material such as a resin is used, instead of a glass substrate of the related art. However, there is a problem that the flexible substrate having a flexible characteristic is difficult to handle in the manufacturing process of a display apparatus. In order to solve the problem, there is provided a flexible substrate disposed on a support substrate that has a sufficient rigidity, the flexible substrate being separated from the support substrate after several processes within the manufacturing process of the display apparatus.

However, the flexible display apparatus of the related art and a method of manufacturing the same have a problem that the flexible display apparatus may not be easily separated from the support substrate in the manufacturing process.

SUMMARY

One or more embodiment of the invention provides a flexible display apparatus that is easily separated from a support substrate, and a method of manufacturing the flexible display apparatus.

One or more embodiment of the invention includes a flexible display apparatus including: a flexible substrate; a display layer on a first surface of the flexible substrate and including a plurality of pixels; graphene on a second surface of the flexible substrate opposite to the first surface; and an encapsulation layer which covers the display layer.

The flexible substrate may have a plurality of concave portions defined in any surface other than the surface on which the display layer is disposed, and the graphene may fill at least a portion of the concave portions. Furthermore, each concave portion may be nano-sized, and have a diameter in a range from about 30 nanometers (nm) to about 200 nm.

According to one or more embodiment of the invention, a method of manufacturing a flexible display apparatus, the method includes: forming a metal layer including microprotrusions, on a support substrate; forming a polymer layer on the metal layer; forming a display layer including a plurality of pixels, on the polymer layer; and separating the polymer layer with the display layer and the encapsulation layer thereon, from the support substrate.

The forming the metal layer may include forming a metal material layer on the support substrate; and forming the microprotrusions on a surface of the metal material layer. Furthermore, the forming of the microprotrusions may include forming nanoprotrusions extended from the metal material layer, by heat treatment; and forming graphene on a surface of the nanoprotrusions. The nanoparticles may respectively have a diameter in a range from about 30 nm to about 200 nm in a diameter.

The forming the metal material layer may include coating a metal material to a thickness in a range from about 100 angstroms (Å) to about 300 Å, on the support substrate.

The forming the metal material layer may include using cobalt (Co), nickel (Ni), iron (Fe) or an alloy thereof.

The forming the polymer layer may include covering an outer side of the metal layer and contacting the support substrate.

The method may further include forming an adhesive layer on the support substrate. The forming the metal layer may include forming the metal layer on the adhesive layer.

The forming the adhesive layer may include forming the adhesive layer using chrome (Cr) or tungsten (W).

The method may further include separating an inner region of the polymer layer from a remainder of the polymer layer, the inner region being separated from outer edges of the metal layer. The separated inner region of the polymer layer may form a flexible substrate of the flexible display apparatus.

Additional features will be set forth in part in the description which follows and, in part, will be apparent from the description, or may be learned by practice of the embodiments.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
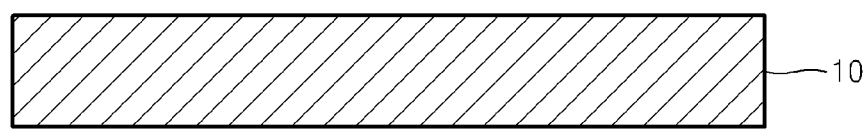
FIGS. 1 to 9 are cross-sectional views schematically describing an embodiment of a method of manufacturing a flexible display apparatus according to the invention.

Reference will now be made in detail to embodiments, examples of which are illustrated in the accompanying drawings, wherein like reference numerals refer to like elements throughout. In this regard, the invention may have different forms and should not be construed as being limited to the descriptions set forth herein. Accordingly, the embodiments are merely described below, by referring to the figures, to explain features of the invention.

As used herein, the term "and/or" includes any and all combinations of one or more of the associated listed items. Expressions such as "at least one of," when preceding a list of elements, modify the entire list of elements and do not modify the individual elements of the list.

Hereinafter, the invention will be described in detail by explaining embodiments of the invention with reference to the attached drawings. Like reference numerals in the drawings denote like elements, and thus their description will not be repeated.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. As used herein, connected may refer to elements being physically and/or electrically connected to each.

Sizes of elements in the drawings may be exaggerated for convenience of explanation. In other words, since sizes and thicknesses of components in the drawings are arbitrarily illustrated for convenience of explanation, the following embodiments are not limited thereto.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "above" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

However, while a certain embodiment may be implemented differently, a specific process order may be performed differently from the described order. For example, two consecutively described processes may be performed substantially at the same time or performed in an order opposite to the described order.

Hereinafter, the invention will be described in detail with reference to the accompanying drawings.

FIGS. 1 to 8 are cross-sectional views schematically describing an embodiment of a method of manufacturing a flexible display apparatus according to the invention.

First, as illustrated in FIG. 1, manufacturing the flexible display apparatus may include using a support substrate 10. The support substrate 10 is used to facilitate handling of a flexible substrate or the like in a subsequent process of manufacturing the flexible display apparatus. In an embodiment, for example, the support substrate 10 may be a glass substrate. However, the support substrate 10 is not limited thereto. In an alternative embodiment, the support substrate 10 may include a material which is relatively rigid other than a glass material and is capable of supporting the flexible substrate in a subsequent process of manufacturing the flexible display apparatus.

Figure 2:
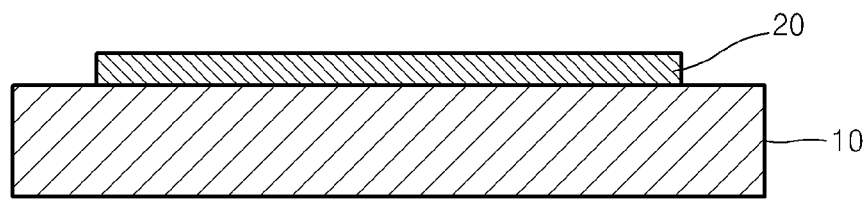

As illustrated in FIG. 2, an adhesive layer 20 may be formed (e.g., provided) on the support substrate 10. The adhesive layer 20 is formed between the support substrate 10 and a collective metal layer 40 (see FIG. 3) so as to enhance the adhesion therebetween. The adhesive layer 20 may be formed of chrome (Cr) or tungsten (W). The adhesive layer 20 may be formed on the support substrate 10 using a method such as thermal deposition or sputtering, but the method is not limited thereto. When a flexible substrate 100 (see FIG. 9) is separated from the support substrate 10, the adhesive layer 20 may prevent nanoparticles 32 (see FIG. 4), which are formed on a surface of the metal layer 40, from being adhered to a bottom of the flexible substrate 100.

Figure 3:
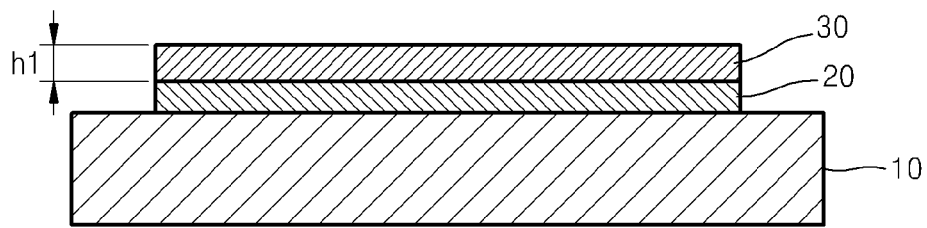

Then, the metal layer 40 including microparticles 36 may be formed on the adhesive layer 20. The metal layer 40 may be formed as follows. As illustrated in FIG. 3, a metal material layer 30 may be formed on the support substrate 10, and then, as illustrated in FIG. 4, the microparticles 36 may be formed on at least a part of the metal material layer 30 surface.

In greater detail, as illustrated in FIG. 3, the metal material layer 30 may be formed on the adhesive layer 20. The metal material layer 30 may be formed of cobalt (Co), nickel (Ni), iron (Fe) or an alloy thereof. The metal material layer 30 may act as a catalyst for forming graphene 34 (see FIG. 4) on a surface of the microparticles 36 which will be described later. Thus, in order to act as a catalyst, the metal material layer 30 may be formed to a cross-sectional thickness h1 of about 100 angstroms (Å) or greater.

Figure 4:
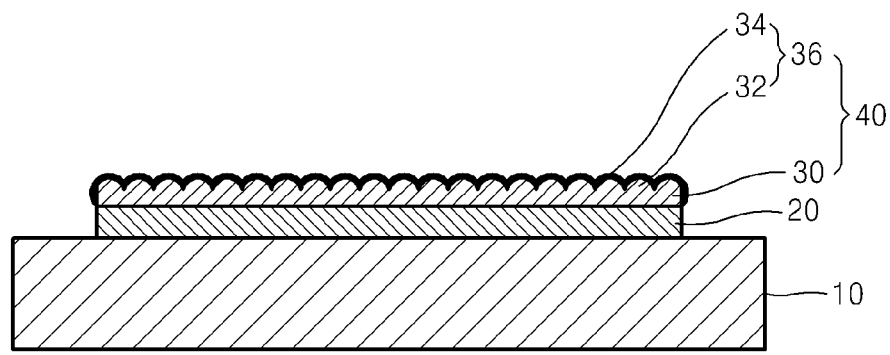

Referring to FIG. 4, the microparticles 36 may be formed on at least a part of the metal material layer 30 surface, such as partially or wholly on an upper surface of the metal material layer 30. The microparticles 36 may protrude from a common (upper) surface of a base portion of the metal material layer 30, and may be otherwise referred to as microprotrusions 36.

The microparticles 36 may be formed as follows. The metal material layer 30 may be subject to heat treatment so as to form the nanoparticles 32 thereon, and then, the graphene 34 may be formed on at least a part of the nanoparticle 32 surface. The nanoparticles 32 may protrude from a common (upper) surface of a base portion of the metal material layer 30, and may be otherwise referred to as nanoprotrusions 32. The microparticles 36 may be formed using a method such as chemical vapor deposition ("CVD"), and the graphene 34 may be formed on at least a part of the nanoparticle 32 surface using the CVD, for example, hot filament CVD ("HFCVD") and microwave plasma CVD ("MPCVD").

Graphene is typically a conductive material having a thickness equal to that of an atomic layer, in which carbon atoms are two-dimensionally arranged in a honeybee shape. Graphite is obtained when carbon atoms are three-dimensionally stacked, a carbon nanotube is obtained when carbon atoms are one-dimensionally rolled in a column shape, and fullerene having a zero-dimensional structure is formed when carbon atoms are arranged in a ball shape. Graphene is formed of only carbon, and thus, is very structurally and chemically stable.

The formation of the microparticles 36 using the HFCVD will be described in detail below.

The HFCVD as a type of the CVD uses reaction gas that is brought into contact with a hot filament, and the reaction gas is separated therefrom by receiving energy. Then, a chemical bonding is induced by the separated reaction gas so as to form a layer. The reaction gas may be a gas mixture of $C_2H_2$, $CH_4$, $C_2H_4$, $C_2H_6$, $C_6H$, or $H_2$.

When the support substrate 10 including the metal material layer 30 thereon is placed in a CVD chamber and proceeds to be heat treated in a vacuum state, catalytic metals forming the metal material layer 30 agglomerate together to form the nanoparticles 32.

Here, a size of the nanoparticles 32 is effectively defined by a thickness of the metal material layer 30, which acts as a catalyst, and a temperature of the support substrate 10. Therefore, in one or more embodiment of the invention according to the manufacturing process conditions, the metal layer 30 may be formed to a cross-sectional thickness ranging from about 100 Å to about 300 Å as described above, and the support substrate 10 maintains a temperature thereof at about 400 degrees Celsius (° C.) or less. When the metal layer 30 is formed to a thickness of less than 100 Å, the nanoparticles 32 may not be formed. When the metal layer 30 is formed to a thickness of greater than 300 Å, the nanoparticles 32 may be formed excessively and contaminate the flexible substrate 100 in the manufacturing process. As an example of contaminating the flexible substrate 100, the nanoparticles 32 may be undesirably adhered to the bottom of the flexible substrate 100, and then, separated together with the flexible substrate 100 in separating the flexible substrate 100 from the support substrate 10, which will be described later.

Therefore, as illustrated in FIG. 4, the nanoparticles 32 may be formed integrally with the metal material layer 30 in a form that is not a complete sphere shape but is close to a semi-sphere shape. The hot filament maintains a temperature thereof at about 1,900° C. or less. As used herein, integral indicates forming a single, unitary, indivisible member. That is a base portion of the metal material layer 30 and the nanoparticles 32 may collectively form a single, unitary, indivisible metal material element.

The nanoparticles 32 formed according to the manufacturing process conditions above may respectively have a diameter ranging from about 30 nanometers (nm) to about 200 nm. The diameter of the nanoparticles 32 may be 30 nm or greater, but when the diameter is 200 nm or greater, the flatness or transparency of the flexible substrate 100 may be degraded. Thus, the nanoparticles 32 may be formed to have a diameter of about 200 nm or less.

In carbonization process that is performed thereafter, a diamond may be formed at a temperature of 2,000° C. or greater. When a catalyst such as Co, Ni, Fe, or an alloy thereof is used in the carbonization process, a carbon nanotube may be formed at a temperature ranging from about 1,800° C. to about 2,000° C. When the carbonization process time is shortened by adjusting an atomic ratio of carbon and hydrogen to 1:5 or greater, carbon atoms contained in the nanoparticles 32 may be precipitated, and then, the microparticles 36 in which a graphene sheet surrounds the nanoparticles 32 may be formed thereafter.

The microparticles 36 may be in a form that the graphene 34 covers the outer edges of the nanoparticles 32 that act as a catalyst. In an embodiment, for example, as illustrated in FIG. 4, the nanoparticles 32 are formed integrally with the metal material layer 30, in a form that is close to a semicircle shape. In this regard, the graphene 34 may be formed on top of the nanoparticle 32 surface, the surface being exposed to outside the microparticles 36 layer. The graphene 34 may also be formed on side surfaces of the nanoparticles 32, such that the graphene 34 may be formed on an entire exposed surface of the nanoparticle 32 surface. A cross-sectional thickness of the graphene 34 taken in a direction normal to the nanoparticle 32 surface.

Figure 5:
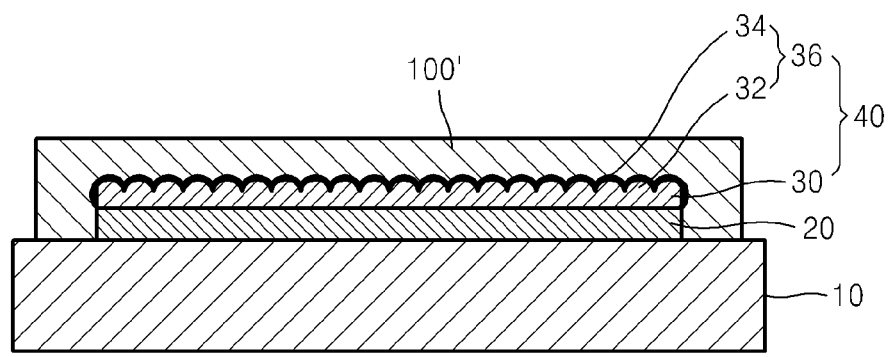

Referring to FIG. 5, a polymer layer 100' may be formed on the metal layer 40 that is cooled after the aforementioned processes. A display layer 200 such as including a plurality of pixels, may be formed on the polymer layer 100'.

As illustrated in FIG. 5, the polymer layer 100' forming a flexible substrate 100 of a display device may be formed on the metal layer 40 including the microparticles 36. The flexible substrate 100 may be formed of an insulating material having flexibility. In an embodiment, for example, the flexible substrate 100 may be formed of polymer materials, such as polyimide ("PI"), polycarbonate ("PC"), polyethersulphone ("PES"), polyethylene terephthalate ("PET"), polyethylenenaphthalate ("PEN"), polyarylate ("PAR"), and fiber glass reinforced plastic ("FRP"). The flexible substrate 100 may be a transparent, a semi-transparent or an opaque substrate.

The polymer layer 100' may be formed to cover an outer side of the metal layer 40 such that a portion of the polymer layer 100' also contacts the support substrate 10. The polymer layer 100' is formed to contact the support substrate 10 to reduce or effectively prevent separation of the polymer layer 100' from the support substrate 10, in a subsequent process such as forming the display layer 200 on the polymer layer 100' which will become the flexible substrate.

Figure 6:
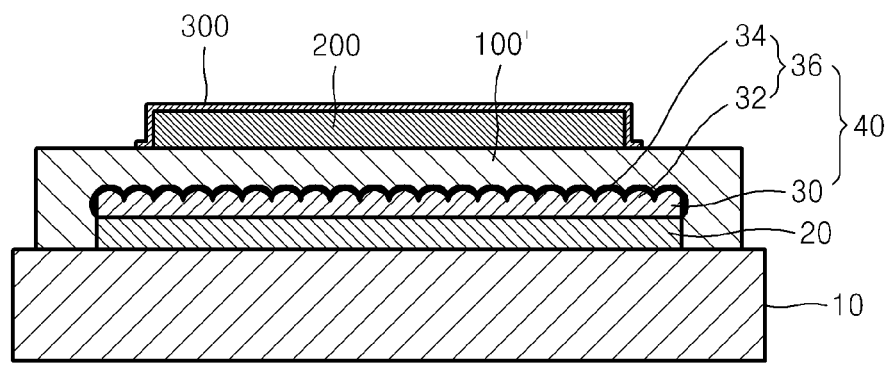

Thereafter, as illustrated in FIG. 6, the display layer 200 such as including a plurality of pixels may be formed on the polymer layer 100'. In an embodiment, the display layer 200 according to the invention may be an organic light-emitting display layer 200, but is not limited thereto. In embodiments, for example, the display layer 200 may be the organic light-emitting display layer 200 that includes a plurality of thin film transistors ("TFTs") and a plurality of pixel electrodes that are connected to the TFTs. Alternatively, the display layer 200 may be a liquid crystal display layer 200. A structure of the display layer 200 will be described in detail with a detailed description of the structure of the flexible display apparatus.

After forming the display layer 200, an encapsulation layer 300 may be formed thereon. The encapsulation layer 300 may have a multi-layered structure (not illustrated) including one or more inorganic layers and one or more organic layers. If the encapsulation layer 300 is formed of organic layers only or inorganic layers only, a display unit which is encapsulated by the encapsulation layer 300 may be damaged by penetration of oxygen or moisture passed from the outside through a fine passage defined within these layers. Therefore, to reduce or effectively prevent damage by the penetration of oxygen or moisture, the encapsulation layer 300 is formed in a multi-layered structure including one or more inorganic layers and one or more organic layers.

Figure 7:
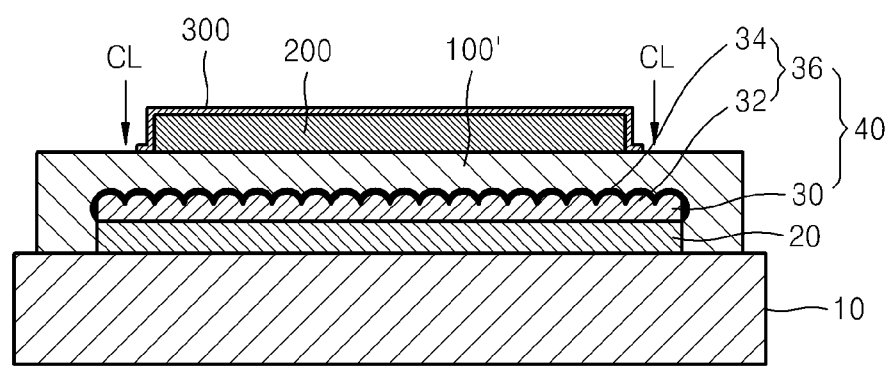

Referring to FIG. 7, the polymer layer 100' including the display layer 200 and the encapsulation layer 300 thereon may be separated such as by cutting along a cutting line ("CL") located spaced apart from outer edges of the polymer layer 100'. The CL may indicate, as illustrated in FIG. 7, an inner region of the polymer layer 100' relative to the outer edges of the metal layer 40. The CL may indicate an inner region of a portion where the polymer layer 100' is not in contact with the support substrate 10, that is, an inner region relative to the outer edges of the metal layer 40. The inner region of the portion where the polymer layer 100' is not in contact with the support substrate 10 is cut to facilitate the separation of a portion of the polymer layer 100' which forms the flexible substrate 100, from a remaining portion of the polymer layer 100' and the support substrate 10.

Figure 8:
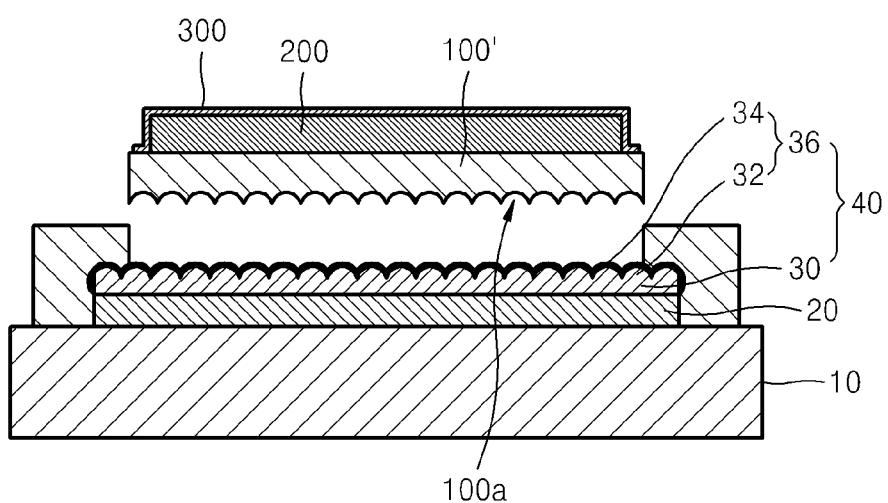

As illustrated in FIG. 8, the polymer layer 100' including the display layer 200 and the encapsulation layer 300 thereon may be separated from the support substrate 10. That is, the portion of the polymer layer 100' separated from the metal layer 40 including the microparticles 36 may be understood to form the flexible substrate 100. At a bottom of the portion of the separated polymer layer 100', as illustrated in FIG. 8, a concave portion 100a may be defined in a profile or shape corresponding to the microparticles 36 of the metal layer 40. Thus, the concave portion 100a formed at the bottom of the flexible substrate 100 may have a diameter d1 in a range from about 30 nm to about 200 nm, the diameter d1 (see FIG. 10) being in same size range as that of the nanoparticles 32 of the microparticles 36 of metal layer 40.

Figure 9:
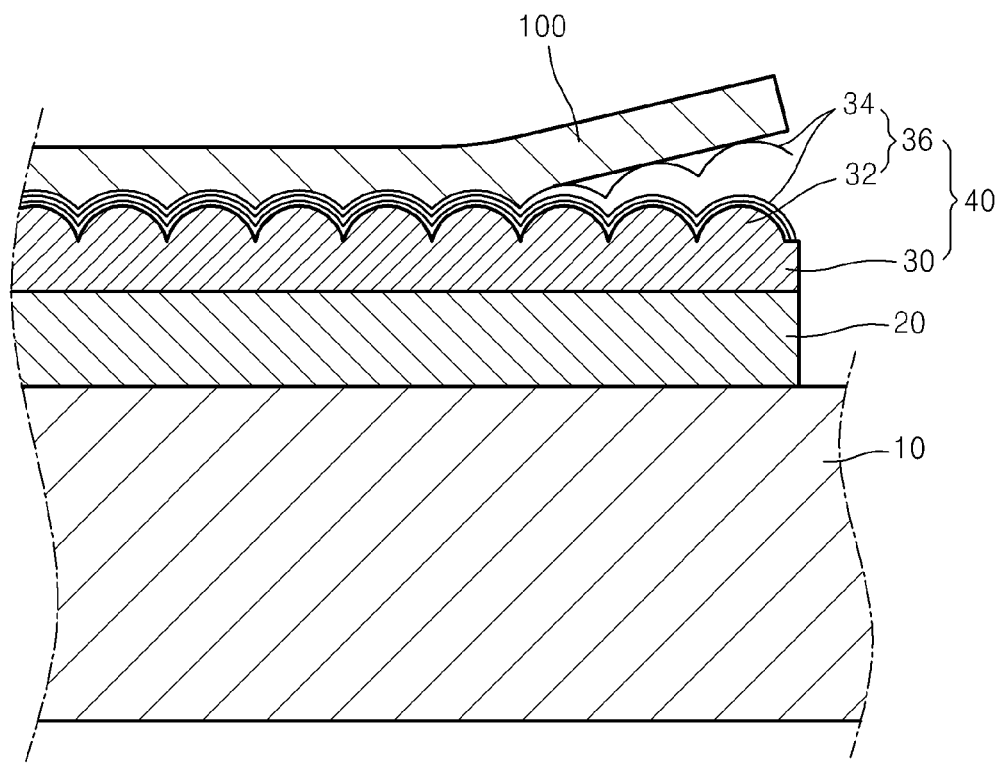

The separation of the flexible substrate 100 from the support substrate 10 is described in greater detail in conjunction with FIG. 9. As described above, the flexible substrate 100 may be formed on the metal layer 40, and the microparticles 36 are formed on to protrude from the surface of the metal layer 40. The microparticles 36 may be in a form in which the graphene 34 is formed on the surface of the nanoparticles 32 including the catalytic metals. As illustrated in FIG. 9, the nanoparticles 32 may be formed integrally with the metal material layer 30, and the graphene 34 is formed to cover the surface of the nanoparticles 32.

The graphene 34 in a sheet form may include multiple layers stacked on the surface of the nanoparticles 32. In this regard, since van der Waals force is the only force available on the stacked layers forming the graphene 34, the layers forming the graphene 34 may have weak adhesion with respect to each other, and accordingly, may be easily separated from each other. Based on such properties of the graphene 34, the flexible substrate 100 may be easily separated from the support substrate 10. FIG. 9 is a diagram illustrating that a portion of the graphene 34 atop the metal layer 40 is separated together in the process of separating the flexible substrate 100 from the support substrate 10. It is shown that one layer among the plurality of layers of the graphene 34 is separated in separating the flexible substrate 100 from the support substrate 10, but the separation of the graphene 34 layers is not limited thereto. In an embodiment, for example, more than one layer among the plurality of layers of the graphene 34 may be separated from the nanoparticles 32 at a time, or all of the layers among the plurality of layers of the graphene 34 may be separated together by adhering to a bottom surface or a part of the bottom surface of the flexible substrate 100.

The separation of the flexible substrate 100 from the support substrate 10 may include irradiating a laser to an interface between the support substrate 10 and the flexible substrate 100, so as to burn or melt a portion of the interface, and thus, the flexible substrate 100 may be separated from the support substrate 10. However, such a method using a laser is difficult to maintain, and in this process, there is a problem that the flexible substrate 10 or an organic light-emitting device ("OLED") of an organic light-emitting display layer is likely to be damaged.

However, one or more embodiment of the flexible display apparatus according to the invention may facilitate the separation of the flexible substrate 100 from the support substrate 10 using only minimal physical force, instead of using a laser, based on the properties of the graphene 34 that is formed as a top surface of the metal layer 40. Accordingly, damage on the flexible substrate 100 and/or an OLED formed thereon may be minimized.

An embodiment of a method of manufacturing the flexible display apparatus has been described only so far, but the invention is not limited thereto. In an alternatively embodiment, for example, a non-flexible display apparatus manufactured according to the above-described manufacturing method is deemed to belong to the scope of the invention as well.

Figure 10:
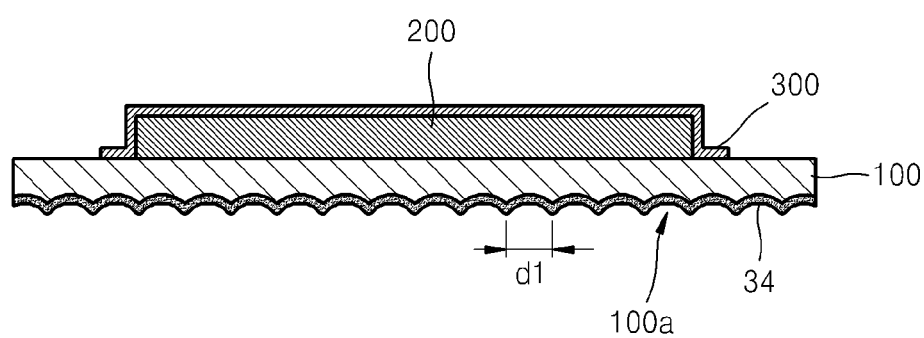
FIG. 10 is a cross-sectional view schematically illustrating an embodiment of a flexible display apparatus according to the invention.
Figure 11:
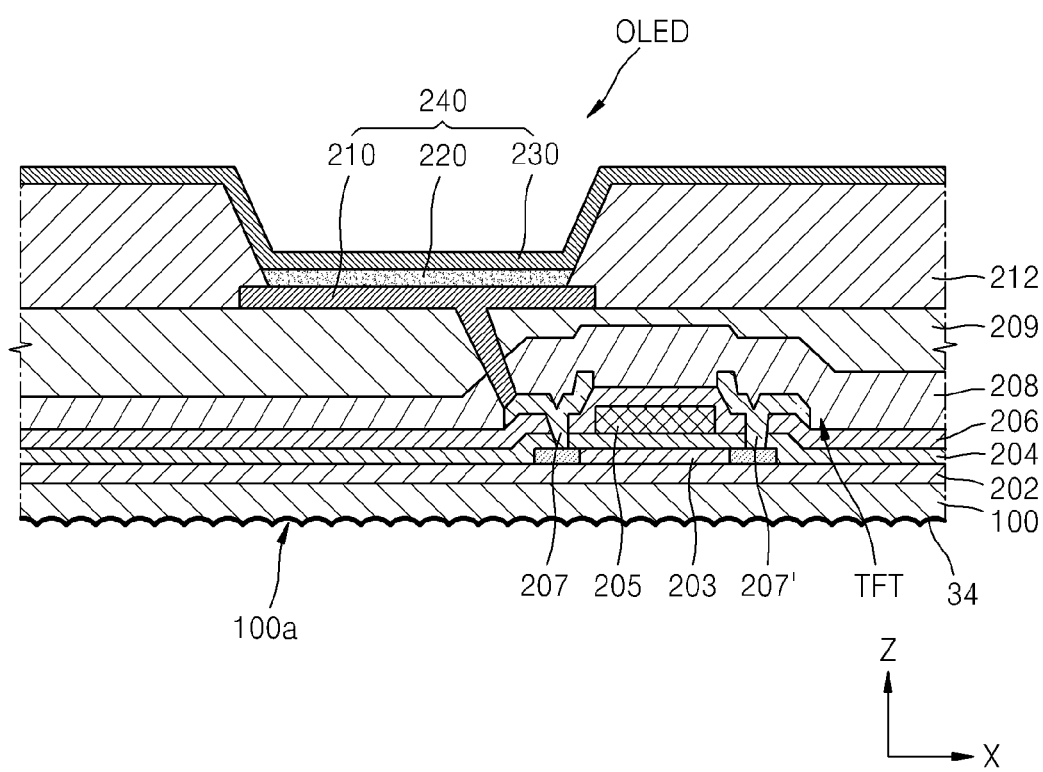
FIG. 11 is a cross-sectional view schematically illustrating an embodiment of an enlarged portion of the flexible display apparatus of FIG. 10.

FIGS. 10 and 11 are each cross-sectional view schematically illustrating an embodiment of a flexible display apparatus according to the invention.

Referring to FIG. 10, the flexible display apparatus includes the flexible substrate 100, the display layer 200 that is disposed on a first surface of the flexible substrate 100, the graphene 34 that is disposed on a second surface of the flexible substrate 100 opposite to the first surface, and the encapsulation layer 300.

The flexible substrate 100 having a flexible characteristic may include various materials, for example, a metal material or a plastic material such as PET, PEN or PI.

The display layer 200 may be disposed on the first surface of the flexible substrate 100 and include a plurality of pixels. The display layer 200 being disposed on the first surface of the flexible substrate 100 typically refers to the display layer 200 being disposed on a top surface of the flexible substrate 100. In an embodiment, the display layer 200 according to the invention may be an organic light-emitting display layer 200 including a plurality of TFTs, and a plurality of pixel electrodes that are connected to the TFTs, but is not limited thereto. In an alternative embodiment, for example, the display layer 200 may be a liquid crystal display layer.

An embodiment of a structure of the display layer 200 according to the invention is described in conjunction with FIG. 11. On the flexible substrate 100, the TFTs may be disposed. A TFT may include a semiconductor layer 203 including amorphous silicon, polycrystalline silicon or an organic semiconductor material, a gate electrode 205, and source and drain electrodes 207' and 207. Hereinafter, the configuration of the TFT will be described in detail.

A buffer layer 202 including silicon oxide or silicon nitride may be disposed on the flexible substrate 100 to planarize a surface of the flexible substrate 100 or to reduce or effectively prevent impurities from penetrating into the semiconductor layer 203 of the TFT, and then, the semiconductor layer 203 may be disposed on the buffer layer 202.

The gate electrode 205 may be disposed on top of the semiconductor layer 203. According to signals applied to the gate electrode 205, the source and drain electrodes 207' and 207 may be electrically connected to each other. The gate electrode 205 may have, in consideration of adhesion between adjacent layers, surface flatness of stacked layers and processability, a single-layer structure or a multi-layered structure including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) or copper (Cu).

In order to insulate from the semiconductor layer 203 and the gate electrode 205, a gate insulating layer 204 including silicon oxide and/or silicon nitride may be disposed between the semiconductor layer 203 and the gate electrode 205.

An interlayer insulating layer 206 may be disposed on top of the gate electrode 205. The interlayer insulating layer 206 may have a single-layer structure or a multi-layered structure including an insulating material, such as silicon oxide or silicon nitride.

The source and drain electrodes 207' and 207 may be disposed on the interlayer insulating layer 206. The source and drain electrodes 207' and 207 may be each electrically connected to the semiconductor layer 203 via contact holes defined in the interlayer insulating layer 206 and the gate insulating layer 204. The source and drain electrodes 207' and 207 may have, in consideration of conductivity of the source and drain electrodes 207' and 207, a single-layer structure or a multi-layered structure including, for example, Al, Pt, Pd, Ag, Mg, Au, Ni, Nd, Ir, Cr, Li, Ca, Mo, Ti, W or Cu.

In order to protect the TFT, a first insulating layer 208 covering the TFT may be disposed as a protective layer. The first insulating layer 208 may include, for example, an inorganic material such as silicon oxide, silicon nitride or silicon oxynitride. As illustrated in FIG. 11, the first insulating layer 208 may be a single-layer structure, but may have various structural modifications including a multi-layered structure.

In addition, a second insulating layer 209 may be disposed on the flexible substrate 100. The second insulating layer 209 may be disposed as a planarization layer or a protective layer. In an embodiment, for example, as illustrated in FIG. 11, when an OLED 240 is disposed on the TFT, the second insulating layer 209 may be disposed as a planarization layer on the first insulating layer 208 to planarize a top surface of the first insulating layer 208 that covers the TFT. The first and second insulating layers 208 and 209 may include, for example, an acryl-based organic material or benzocyclobutene ("BCB"). As illustrated in FIG. 11, the gate insulating layer 204, the interlayer insulating layer 206, the first insulating layer 208 and the second insulating layer 209 may be disposed on the whole surface of the flexible substrate 100.

In some embodiments, a third insulating layer 212 may be disposed on top of the TFT, and the third insulating layer 212 may be disposed as a pixel defining layer. The third insulating layer 212 may be disposed on the above-described second layer 209, and an aperture may be defined therein. The third insulating layer 212 may have a function to define a pixel region on the flexible substrate 100.

The OLED 240 may be disposed on the third insulating layer 212. The OLED 240 may include a first (e.g., pixel) electrode 210, an intermediate layer 220 including an emission layer ("EML"), and a second (e.g., opposite) electrode 230.

As illustrated in FIG. 11, the pixel electrode 210 may be disposed on the third insulating layer 212, and an aperture may be defined in the first and second insulating layers 208 and 209 that exposes at least one of the drain and source electrodes 207' and 207 of the TFT. Accordingly, the pixel electrode 210 may contact the exposed drain and source electrode 207' and 207 of the TFT through the aperture, thereby being electrically connected to the TFT.

The pixel electrode 210 may be a (semi-)transparent or reflective electrode. Where the pixel electrode 210 is the (semi-)transparent electrode, the pixel electrode 210 may include, for example, indium tin oxide ("ITO"), indium zinc oxide ("IZO"), zinc oxide ("ZnO"), $In_2O_3$, indium gallium oxide ("IGO") or aluminum zinc oxide ("AZO"). Where the pixel electrode 210 is the reflective electrode, the pixel electrode 210 may include a reflective layer including Ag, Mg, Al, Pt, Pd, Au, Ni, Nd, Ir, Cr, or a compound thereof, and a layer including of ITO, IZO, ZnO, $In_2O_3$, IGO, or AZO. The invention is not limited to the above-described materials or structures, and may have various modifications including various materials and structures including a single-layer structure or a multi-layered structure.

A pixel region defined by the third insulating layer 212 may include therein, the intermediate layer 220 including the EML. The intermediate layer 220 of the OLED 240 may include a hole injection layer ("HIL"), a hole transport layer ("HTL"), an electron transport layer ("ETL") and/or an electron injection layer ("EIL"), which are stacked in a single or composite structure, in addition to the EML. The configuration of the intermediate layer 220 is not limited thereto, and may have various structural modifications as well.

The opposite electrode 230 covering the intermediate layer 220 that includes the EML and facing the pixel electrode 210 may be disposed on the whole surface of the flexible substrate 100. The opposite electrode 230 may be a (semi-)transparent or reflective electrode.

Where the opposite electrode 230 is the (semi-)transparent electrode, the opposite electrode 230 may include a layer including of a metal with a relatively small work function, such as Li, Ca, LiF/Ca, LiF/Al, Al, Ag, Mg or a compound thereof, and a (semi-)transparent conductive layer including ITO, IZO, ZnO or $In_2O_3$. Where the opposite electrode 230 is the reflective electrode, the opposite electrode 230 may include a layer including Li, Ca, LiF/Ca, LiF/Al, Al, Ag, Mg or a compound thereof. The components and materials of the opposite electrode 230 are not limited thereto, and may have various modifications as well.

Referring to FIG. 10, the encapsulation layer 300 may be disposed on the flexible substrate 100 so as to cover the display layer 200. Although not illustrated, the encapsulation layer 300 may have a multi-layered structure including one or more inorganic layer and one or more one organic layer. If the encapsulation layer 300 includes organic layers only or inorganic layers only, a display unit encapsulated by the encapsulation layer 300 may be damaged by penetration of oxygen or moisture passed from the outside through a fine passage formed within these layers. Therefore, to reduce or effectively prevent damage to the display unit by the penetration of oxygen or moisture, the encapsulation layer 300 has a multi-layered structure including one or more inorganic layer and one or more one organic layer.

An embodiment of the flexible substrate 100 according to the invention may include the concave portion 100a defined over the whole lower surface of the flexible substrate 100. The lower surface of the flexible substrate 100 refers to a surface opposite to the upper surface on which the display layer 200 is disposed. The concave portion 100a may be shaped or profiled in an embossing form, and in an embodiment of forming the flexible substrate, the graphene 34 may be disposed to fill the whole concave portion 100a or at least a part of the concave portion 100a defined at the bottom of the flexible substrate 100.

Here, each concave portion 100a of the flexible substrate 100 may be nano-sized, and have a diameter d1 ranging from about 30 nm to about 200 nm. According to the method of manufacturing the flexible display apparatus as described above, the nanoparticles 32 may be formed to a diameter of at least 30 nm on the metal layer 40 disposed on the bottom of the flexible substrate 100. When the diameter of the concave portion 100a is 200 nm or greater, the transparency of the flexible substrate 100 may be degraded, and thus, each concave portion 100a may have a diameter in a range from about 30 nm to about 200 nm.

The graphene 34 may be disposed on the lower surface of the flexible substrate 100. The graphene 34 may be disposed on the lower surface of the flexible substrate 100 in a form of a thin film, or may be partially disposed on the lower surface of the flexible substrate 100. The graphene 34 disposed on the lower surface of the flexible substrate 100 may be a residue remained from the above-described process of manufacturing the flexible display apparatus.

The separation of the flexible substrate 100 from the support substrate 10 may include irradiating a laser to an interface between the support substrate 10 and the flexible substrate 100, so as to burn or melt a portion of the interface, and thus, the flexible substrate 100 may be separated from the support substrate 10. However, such a method using a laser is difficult to maintain, and in this process, there is a problem that the flexible substrate 10 or an OLED is likely to be damaged.

In one or more embodiment of the invention, the graphene 34 in a sheet form may include multiple layers stacked on the surface of the nanoparticles 32. In this regard, since van der Waals force is the only force available on the stacked layers forming the graphene 34, the layers of the graphene 34 may have weak adhesion with respect to each other, and accordingly, may be easily separated from each other. Based on such properties of the graphene 34, the flexible substrate 100 may be easily separated from the support substrate 10.

One or more embodiment of the invention of the flexible display apparatus according to the invention may facilitate the separation of the flexible substrate 100 from the support substrate 10 using only little physical force, instead of using a laser, based on the properties of the graphene 34 that is formed on the surface of the metal layer 40. Accordingly, the damage to the flexible substrate 100 or an OLED formed thereon may be minimized.

As described above, according to one or more of the above-described embodiments of the invention, a flexible display apparatus that is capable of being easily separated from a substrate and a method of manufacturing the flexible display apparatus may be realized.

It should be understood that the embodiments described therein should be considered in a descriptive sense only and not for purposes of limitation. Descriptions of features within each embodiment should typically be considered as available for other similar features in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing a flexible display apparatus, the method comprising:
   forming a metal layer comprising microprotrusions, on a support substrate;
   forming a polymer layer on the metal layer;
   forming a display layer comprising a plurality of pixels, on the polymer layer;
   forming an encapsulation layer on the display layer; and
   separating the polymer layer with the display layer and the encapsulation layer thereon, from the support substrate.

2. The method of claim 1, wherein the forming the metal layer comprises:
   forming a metal material layer on the support substrate; and
   forming the microprotrusions extended from a surface of the metal material layer.

3. The method of claim 2, wherein the forming the microprotrusions comprises:
   forming nanoprotrusions extended from the surface of the metal material layer, by heat treatment; and
   forming graphene on a surface of the nanoprotrusions.

4. The method of claim 3, wherein the nanoprotrusions respectively have a diameter in a range from about 30 nanometers to about 200 nanometers.

5. The method of claim 2, wherein the forming the metal material layer comprises forming a metal material comprising cobalt, nickel, iron or an alloy thereof, on the support substrate.

6. The method of claim 5, wherein the forming the metal material layer further comprises coating the metal material to a thickness ranging from about 100 angstroms to about 300 angstroms.

7. The method of claim 1, wherein the forming the polymer layer comprises covering an outer side of the metal layer and contacting the support substrate.

8. The method of claim 1, further comprising forming an adhesive layer on the support substrate,
   wherein the forming the metal layer comprises forming the metal layer on the adhesive layer.

9. The method of claim 8, wherein the forming the adhesive layer comprises forming an adhesive material including chrome or tungsten, on the support substrate.

10. The method of claim 7, further comprising:
    separating an inner region of the polymer layer from a remainder of the polymer layer, the inner region separated from outer edges of the metal layer,
    wherein the separated inner region of the polymer layer forms a flexible substrate of the flexible display apparatus.

11. The method of claim 10, wherein in the separating the inner region of the polymer layer from the remainder of the polymer layer, the display layer and the encapsulation layer are on the separated inner region of the polymer layer.

12. The method of claim 3, further comprising:
    separating an inner region of the polymer layer from a remainder of the polymer layer, the inner region separated from outer edges of the metal layer, wherein the separated inner region of the polymer layer forms a flexible substrate of the flexible display apparatus.

13. The method of claim 12, wherein in the separating the inner region of the polymer layer from the remainder of the polymer layer, the display layer and the encapsulation layer are on the separated portion of the polymer layer.

14. The method of claim 13, wherein in the separating the inner region of the polymer layer from the remainder of the polymer layer, a layer of the graphene is separated from the surface of the nanoprotrusions and remains on the flexible substrate.

* * * * *